(12) United States Patent
Pierrat

(10) Patent No.: US 7,926,001 B2
(45) Date of Patent: Apr. 12, 2011

(54) UNIFORMITY FOR SEMICONDUCTOR PATTERNING OPERATIONS

(75) Inventor: Christophe Pierrat, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 474 days.

(21) Appl. No.: 12/014,958

(22) Filed: Jan. 16, 2008

(65) Prior Publication Data

US 2010/0299646 A1  Nov. 25, 2010

(51) Int. Cl.
G06F 17/50 (2006.01)
G03F 1/00 (2006.01)
H01L 21/302 (2006.01)

(52) U.S. Cl. .......... 716/50; 716/55; 430/5; 438/706

(58) Field of Classification Search .......... 716/19, 716/21, 50, 55; 438/706; 430/5
See application file for complete search history.

(56) References Cited

U.S. PATENT DOCUMENTS

| | | | |
|---|---|---|---|
| 6,617,083 B2 | 9/2003 | Usui | |
| 6,723,607 B2 | 4/2004 | Nam | |
| 6,723,640 B2 | 4/2004 | Lee | |
| 7,257,790 B2 | 8/2007 | Maeda | |
| 7,669,176 B2 * | 2/2010 | Haffner | ............ 716/21 |
| 7,741,221 B2 * | 6/2010 | Tian et al. | ............ 438/689 |
| 2006/0278956 A1 | 12/2006 | Cadouri | |
| 2007/0087571 A1 * | 4/2007 | Chang et al. | ............ 438/706 |
| 2007/0117310 A1 | 5/2007 | Bai | |
| 2007/0143733 A1 | 6/2007 | Zach | |
| 2009/0146322 A1 * | 6/2009 | Weling et al. | ............ 257/786 |

* cited by examiner

Primary Examiner — Stacy A Whitmore
Assistant Examiner — Magid Y Dimyan
(74) Attorney, Agent, or Firm — Sheppard Mullin Richter & Hampton LLP

(57) ABSTRACT

Systems and methods of semiconductor device optimization include a system and method to determine a dataset for a layer of the semiconductor device, where the operation includes receiving a dataset defining a plurality of original patterns of sacrificial material in a layer of a semiconductor device, wherein the original patterns of sacrificial material are used to define placement of spacer material to define patterning of circuit elements for the semiconductor device; determining densities of the plurality of original patterns of sacrificial material in areas across a portion of the layer of the semiconductor device; and augmenting the dataset to include an additional pattern of sacrificial material in an area of the layer having a density lower than a threshold density.

18 Claims, 8 Drawing Sheets

UNIFORMITY FOR SEMICONDUCTOR PATTERNING OPERATIONS

TECHNICAL FIELD

The present invention relates to device manufacturing, and more particularly, some embodiments relate to semiconductor device lithography techniques.

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages (HDLs), such as Verilog®, RTM® or VHSIC hardware description language (VHDL), for example. Through the use of HDLs, the designer creates an integrated circuit by hierarchically defining functional components of the circuit.

From the HDL or other high-level description, the actual logic cell implementation may be determined by logic synthesis, which converts the functional description of the circuit into a specific circuit implementation. The logic cells are then assigned physical locations in the device layout and their interconnections are defined. This is sometimes referred to as layout and routing. The placement and routing tools used by designers generally accept as their input a flattened netlist that has been generated by the logic synthesis process. This flattened netlist identifies the specific logic cell instances from a target standard cell library, and describes the specific cell-to-cell connectivity. By application of a physical design process, the logic cells of the netlist file are placed and routed, resulting in a layout file. This layout, then, can be transferred or applied to the semiconductor substrate in a series of layers that collectively will form the devices that make up the components of the integrated circuit.

A process by which such layers are patterned on the substrate is known as photolithography. During photolithography, a series of photomasks created from the layout file are used to transfer the layout onto the substrate layer by layer. There are different types of photomasks including binary, chrome-on-glass, attenuated phase-shifting masks (attPSM) and alternating phase-shifting masks (altPSM). A photomask, or more simply a mask, provides an image of the physical geometries of its associated integrated circuit layer or parts of a layer. Passing light through transparent sections defined by the mask elements transfers the layout pattern for the associated layer onto the wafer. The light pattern is passed through an imaging lens system and focused at the desired size on the wafer surface. A typical photolithography system uses UV light energy to project the mask pattern onto the wafer surface. The projected light pattern interacts with a photosensitive coating on the wafer and, depending on the coating used; it can be cured or rendered susceptible to removal as a result of the exposure. Accordingly, the projection of the mask pattern onto the coating can be used to transfer the pattern to the wafer.

With a continuing desire to provide greater functionality in smaller packages and the evolution of more complex system-on-chip and mixed-signal designs, IC feature geometries are being driven to smaller and smaller dimensions. Also, the shrinking of feature dimensions can lead to an increase of the number of chips that can be obtained from a given wafer. However, the ability to project an accurate image of increasingly smaller features onto the wafer is limited by the wavelength of the light used, and the ability of the lens system to capture enough diffraction orders from the illuminated mask.

The minimum feature size that a projection system can print can be approximated by:

$$F = k1 * \frac{\lambda}{N_A}$$

where F is the minimum feature size, k1 is a coefficient of process-related factors, λ is the wavelength of light used and $N_A$ is the numerical aperture of the lens as seen from the wafer. Using currently available exposure tools, k1 is limited to 0.25 (for a single exposure). With lithography processes using deep ultraviolet (DUV) light with wavelengths of 248 to 193 nm, minimum feature sizes of approximately 50 nm can be achieved. Accordingly, the resolution limit of conventional optical lithography technology is increasingly being challenged by the sub wavelength, or low-k1, dimensions of the critical IC feature geometries.

Not only are the critical dimension feature geometries decreasing in size in accordance with, or even faster than, Moore's Law predictions, the already large number of these feature geometries is growing at a dramatic rate as well. Furthermore, due to the necessity to mitigate optical proximity effect distortions through resolution enhancement techniques at the mask level, the overall polygonal Figure count is skyrocketing. These critical feature geometries are patterned far more precisely as well due to the severity and sensitivity of the non-linear imaging. Extreme precision is required for sub wavelength, or low-k1, applications due to highly non-linear imaging behaviors, which often magnify mask errors by large factors and in non-intuitive manners.

With current lithography technology at wavelengths of 193 nm, optical characteristics of the light are affecting the ability to decrease feature sizes. One approach to increasing resolution is to move to a smaller wavelength of light. For example, some approaches have moved to light in approximately the 13.5 nm extreme UV range. However, such trends have proven difficult for a number of reasons and designers have moved to non-lithographic enhancements to increase pattern density.

One class of technologies presently used to enhance feature density is referred to as double patterning or multiple patterning. There are several types of double patterning in use, the four most common being: double exposure, spacer mask, heterogeneous mask, and intermediate pattern accumulation. FIG. 1 is a diagram illustrating one example of spacer or self-aligned double patterning. Referring now to FIG. 1, in the first part of the process 100, a sacrificial layer 10 is laid down over a substrate comprising one or more hard mask layers 15, which are in turn deposited over the actual layer 20 that is to be patterned. Sacrificial layer 10 is typically made of poly-silicon.

Next, as illustrated at 101, a spacer material 25 such as, for example, silicon nitride or silicon oxide is deposited over the wafer. Also illustrated at 101 is the patterning of a photoresist 30 to protect the spacer material in selected locations. Accordingly, another mask layer is used to apply patterns of photoresist 30 at desired locations. As illustrated at 102, spacer material 25 is etched anisotropically, preferentially removing the spacer material on the horizontal surfaces. As a result, the structure illustrated in 103 remains, sacrificial layer 10 having been etched away. After a subsequent etch process is performed, the spacer pattern is transferred or etched to the underlying layer 20 as illustrated at 104.

FIG. 2 is a diagram illustrating a top view of the self-aligned double patterning process and the masks used to make the illustrated features. FIG. 2 shows patterns 12 created by sacrificial layer 10 and Mask A, patterns 14 created by spacer 35 after spacer etch, and components of logic devices 16 created by feature Mask B. With reference to FIG. 1, it is noted that mask B corresponds to patterning of photoresist 30.

Referring again to FIG. 2, as this Figure illustrates, once the polysilicon lines 12 are removed, spacer lines 14 are remaining and the density is approximately doubled. In order to remove the short 50 between each pair of spacer lines 14, a third mask layer mask C is used to remove the unwanted parts of spacer that short remaining trace lines as illustrated by dashed lines 45. As the examples provided in FIGS. 1 and 2 illustrate, for each feature line 12 of sacrificial layer 10, the process yields two lines 14, thereby doubling the density.

BRIEF SUMMARY OF EMBODIMENTS OF THE INVENTION

According to various embodiments of the invention systems and methods for determining a dataset for a layer of a semiconductor device include operations of receiving a dataset defining a plurality of original patterns of sacrificial material in a layer of a semiconductor device, wherein the original patterns of sacrificial material are used to define placement of spacer material to define patterning of circuit elements for the semiconductor device; determining densities of the plurality of original patterns of sacrificial material in areas across a portion of the layer of the semiconductor device; and augmenting the dataset to include an additional pattern of sacrificial material in an area of the layer having a density lower than a threshold density. In one embodiment, the threshold density can be determined based on predefined spacer widths, while in another embodiment, the threshold density is determined based on the density of an area of the layer having the highest density of original patterns.

In a further embodiment, the operations can include determining a variation in the density of original patterns across the portion of the layer, and determining the additional pattern to be added to an area of lower density based on a difference in density between an area of higher density and the area having a density lower than a determined threshold density. In another embodiment, the operation can further include calculating a loading pattern density based on the determined density of original patterns across the area. The additional patterns of sacrificial material can comprise extraneous patterns that provide no electrical function to the circuit.

In still a further embodiment, a semiconductor device having a plurality of layers includes a series of elements formed by a spacer double patterning process and a dataset used for spacer double patterning is augmented by a method that includes the operations of: receiving a dataset defining a plurality of original patterns of sacrificial material in a layer of a semiconductor device, wherein the original patterns of sacrificial material are used to define placement of spacer material to define patterning of circuit elements for the semiconductor device; determining densities of the plurality of original patterns of sacrificial material in areas across a portion of the layer of the semiconductor device; and augmenting the dataset to include an additional pattern of sacrificial material in an area of the layer having a density lower than a threshold density. In one embodiment, the threshold density can be determined based on predefined spacer widths, while in another embodiment, the threshold density is determined based on the density of an area of the layer having the highest density of original patterns.

In yet a further embodiment, the operations of augmenting the dataset can include determining a variation in the density of original patterns across the portion of the layer, and determining the additional pattern to be added to an area of lower density based on a difference in density between an area of higher density and the area having a density lower than a determined threshold density. In another embodiment, the operation can further include calculating a loading pattern density based on the determined density of original patterns across the area. The additional patterns of sacrificial material can comprise extraneous patterns that provide no electrical function to the circuit.

In still another embodiment, a computer aided design apparatus for generating a data file for a layer of a semiconductor device includes a processor; a memory connected to the processor; and a computer readable medium having computer program code embedded therein, the computer program code configured to cause the processor to perform the operations of: receiving a dataset defining a plurality of original patterns of sacrificial material in a layer of a semiconductor device, wherein the original patterns of sacrificial material are used to define placement of spacer material to define patterning of circuit elements for the semiconductor device; determining densities of the plurality of original patterns of sacrificial material in areas across a portion of the layer of the semiconductor device; and augmenting the dataset to include an additional pattern of sacrificial material in an area of the layer having a density lower than a threshold density.

In yet a further embodiment, a method of determining a dataset for a layer of a semiconductor device includes processes of: receiving a dataset defining a plurality of original patterns of sacrificial material in a layer of a semiconductor device, wherein the original patterns of sacrificial material are used to define placement of spacer material to define patterning of circuit elements for the semiconductor device; determining densities of the plurality of original patterns of sacrificial material in areas across a portion of the layer of the semiconductor device; and altering the density in an area of the layer to achieve a desired spacer material width. In one application, the density is altered by adding an additional pattern of sacrificial material in the area of the layer.

In still a further embodiment, a method of determining a dataset for a layer of a semiconductor device includes: receiving a dataset for an integrated circuit design, the dataset defining a plurality of original patterns of sacrificial material in a layer of a semiconductor device, wherein the original patterns of sacrificial material are used to define placement of spacer material to define patterning of circuit elements for the semiconductor device; determining densities of the plurality of original patterns of sacrificial material in areas across a portion of the layer of the semiconductor device; and altering the integrated circuit design to adjust the density of original patterns in an area of the layer to achieve a desired spacer material width for that area.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following Figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the Figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

The Figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed in various embodiments toward semiconductor devices and systems and methods for semiconductor processing. Particularly, some embodiments relate to spacer double patterning for semiconductor processing. In one embodiment, double patterning technology can be used to create logic elements for integrated circuit devices. In a further embodiment, the double patterning technology can be used to provide a self-aligned technique for enhanced resolution photolithography operations. In yet another embodiment, double patterning technology can be utilized to create features of differing widths without the extra mask operation needed in conventional spacer double patterning technology to add materials to create increased width elements.

Figure 1:
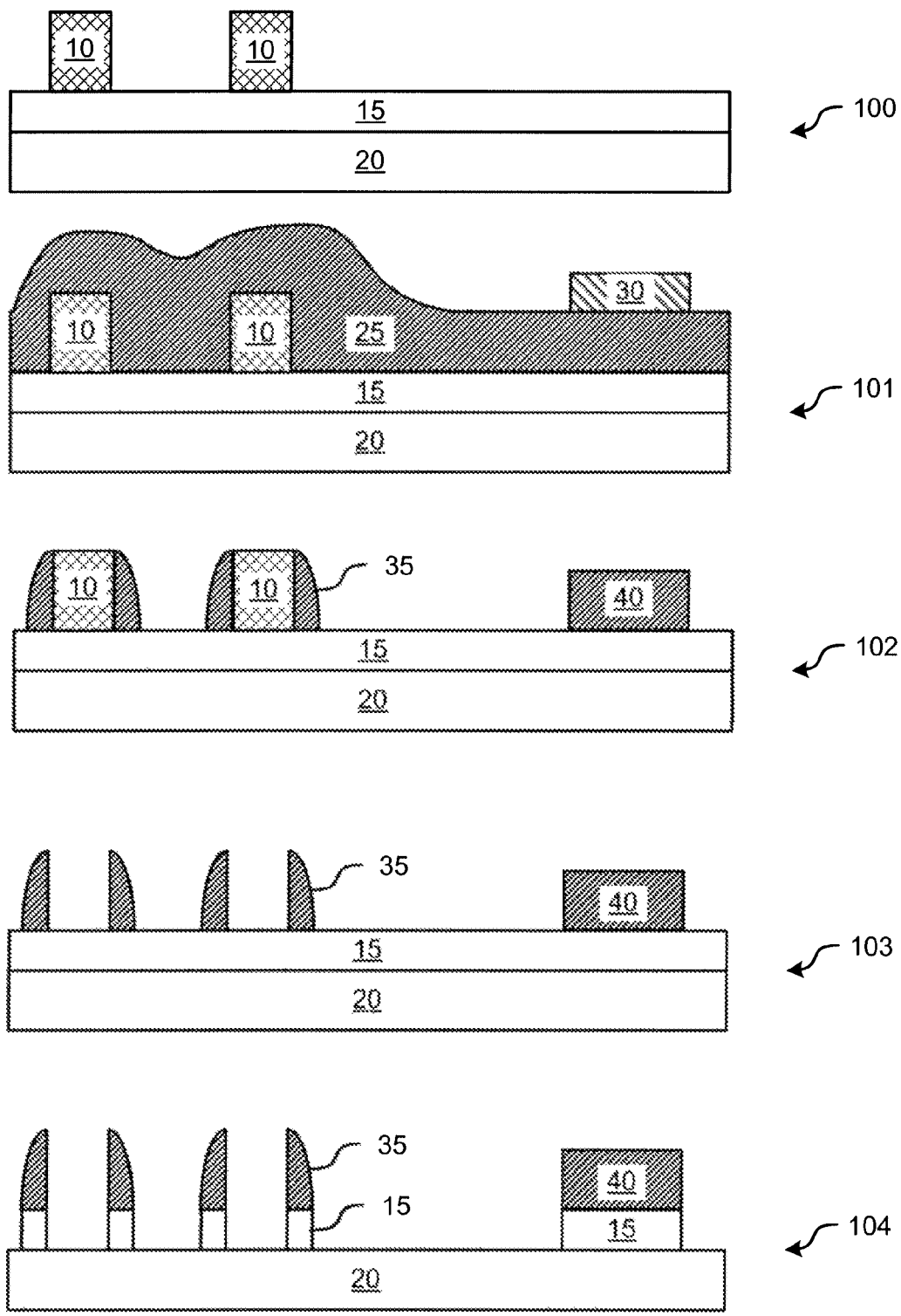
FIG. 1 is a diagram illustrating one example of spacer or self-aligned double patterning.
Figure 2:
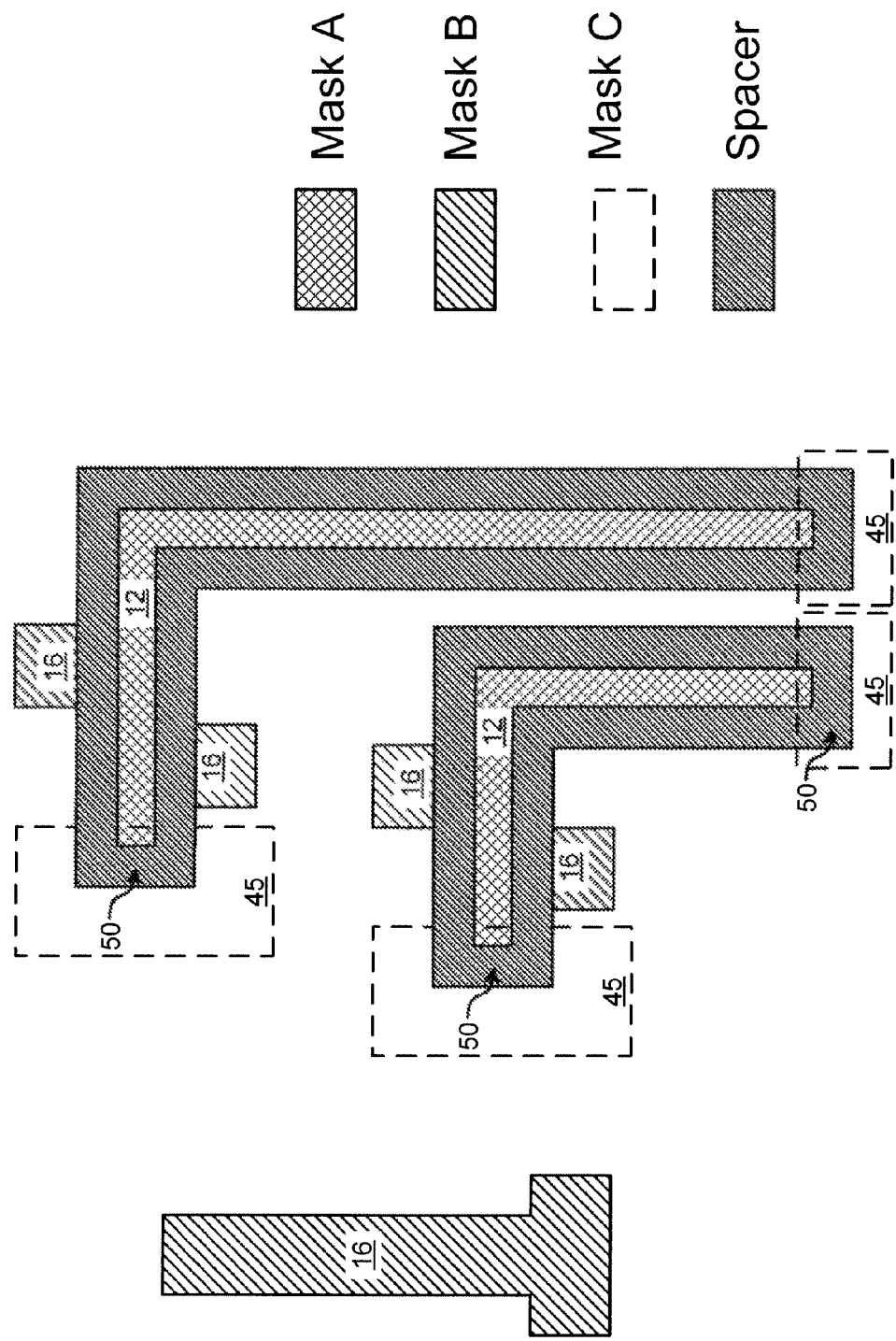
FIG. 2 is a diagram illustrating a top view of a self-aligned double patterning process and masks used to make the illustrated features.
Figure 3:
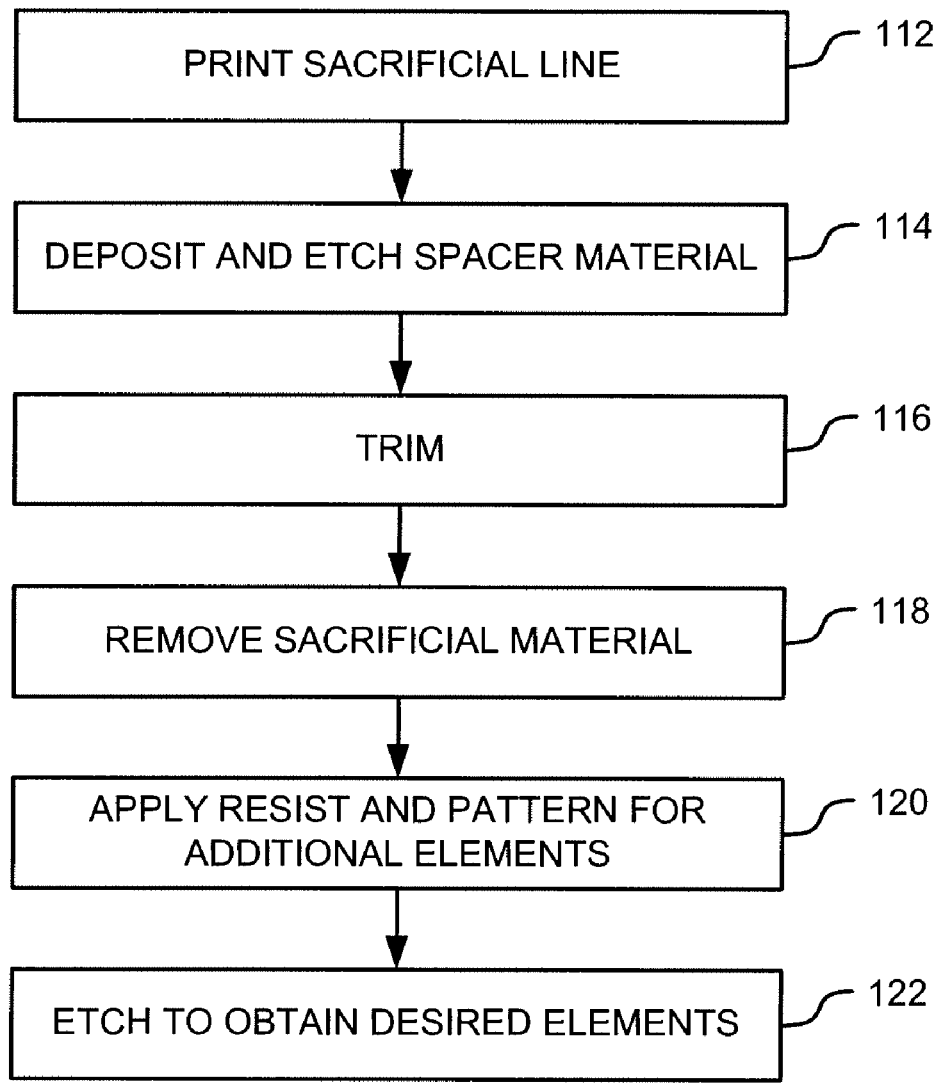
FIG. 3 is a diagram illustrating an example process for spacer double patterning in accordance with one embodiment of the invention.
Figure 4:
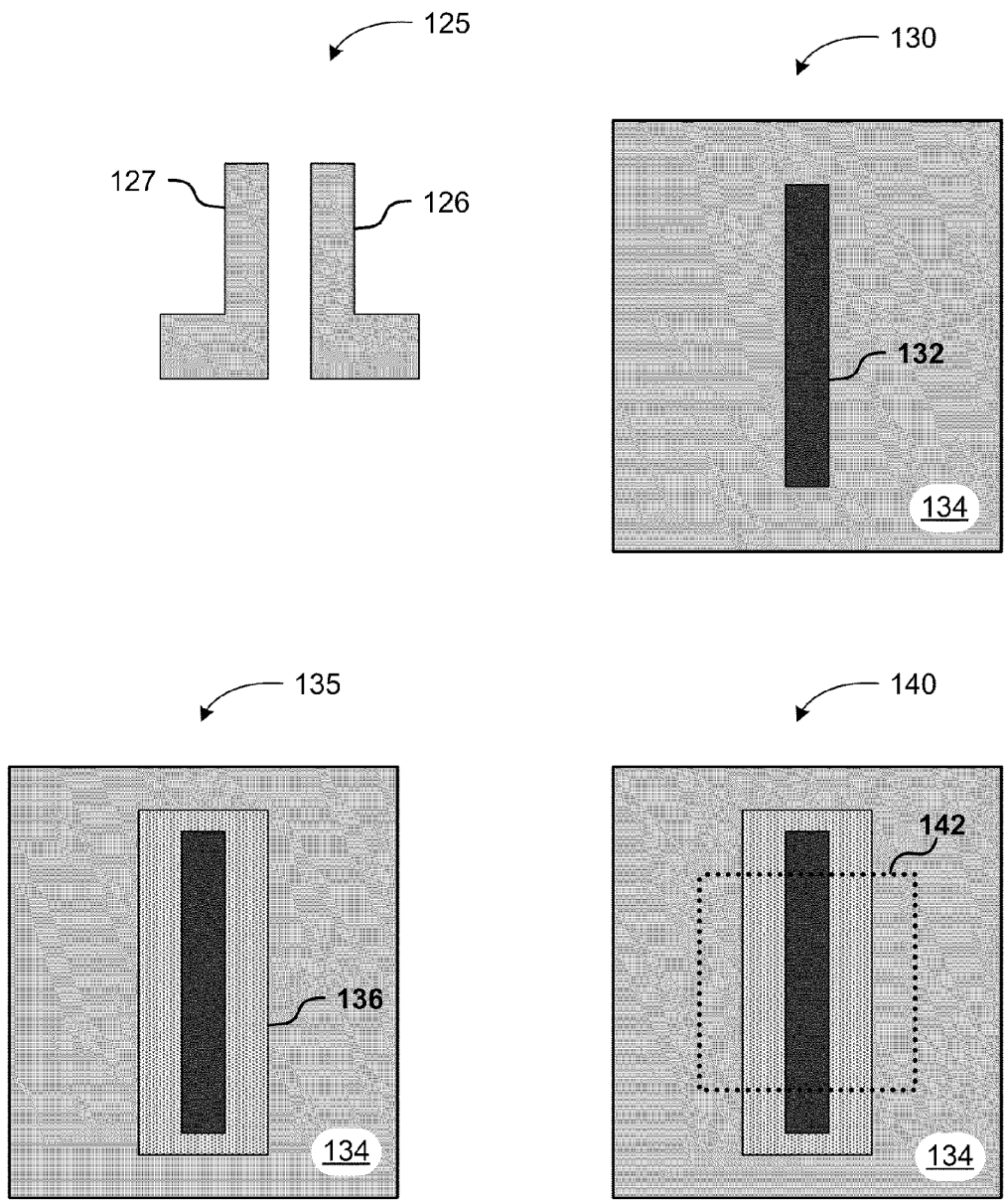
FIG. 4 is a diagram illustrating patterns used in the spacer double patterning process in accordance with one embodiment of the invention.
Figure 5:
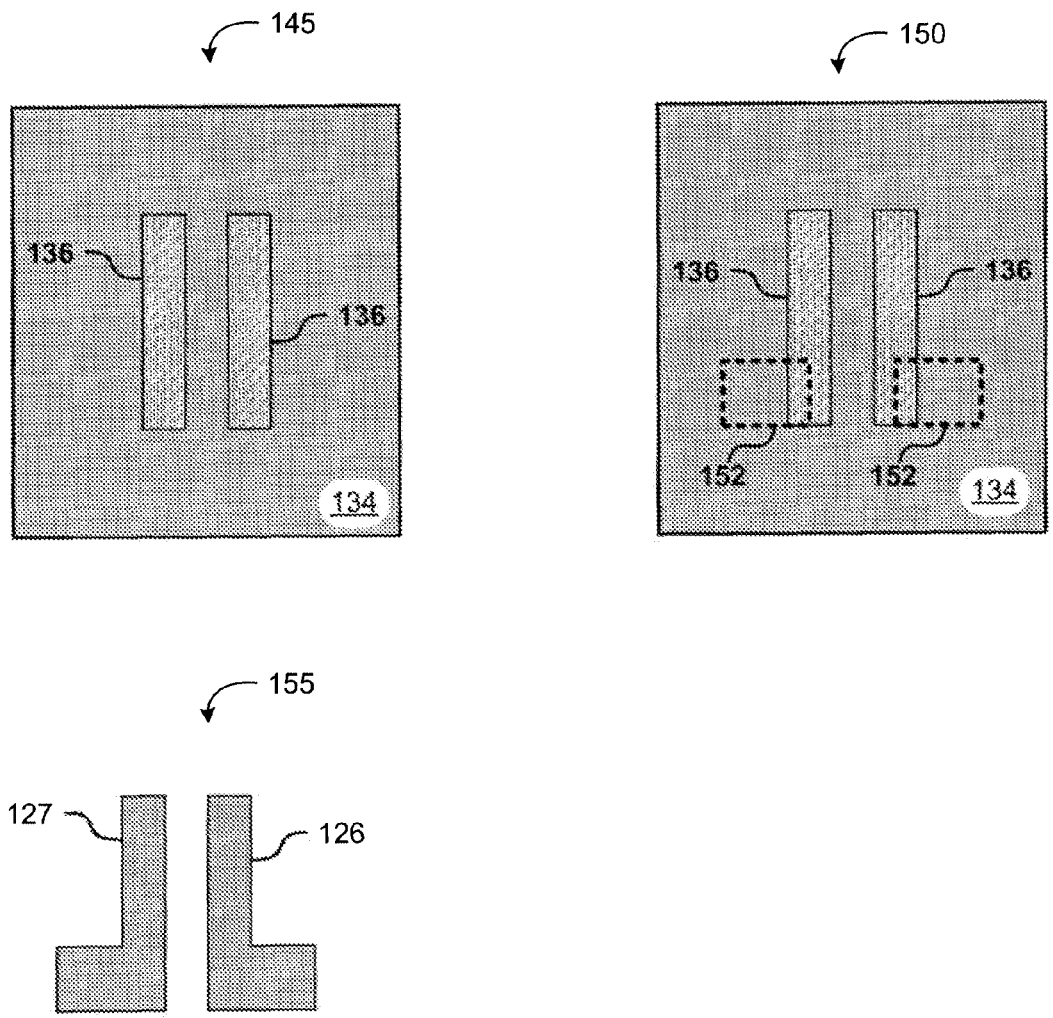
FIG. 5 is a diagram illustrating additional example patterns used in the spacer double patterning process as well as the final layout elements obtained by the process in accordance with one embodiment of the invention.

FIG. 3 is a diagram illustrating an example process for spacer double patterning in accordance with one embodiment of the invention. FIG. 4 is a diagram illustrating patterns used in the spacer double patterning process in accordance with one embodiment of the invention. FIG. 5 is a diagram illustrating additional example patterns used in the spacer double patterning process as well as the final layout elements obtained by the process in accordance with one embodiment of the invention. Referring now to FIGS. 3, 4 and 5, this embodiment is now described. In this example, the process is intended to create a layout elements 127, 126 as illustrated in FIG. 4 at 125. To arrive at these features, at operation 112 a sacrificial line is printed. This line is illustrated at 130 of FIG. 4 as material 132 printed on a substrate 140. In the illustrated example, patterns 126, 127 will ultimately be made from substrate material 134. For logic elements, semiconductor strike that substrate material 134 might be a semiconductor material such as, for example, silicon, germanium, gallium arsenide, and the like.

At operation 114, spacer material is deposited over the substrate and then etched. In one embodiment, a spacer material such as silicon oxide or silicon nitride is deposited and etched in accordance with conventional spacer techniques. As described further below, in one embodiment, fill patterns or loading patterns can be added to the substrate to achieve a more uniform distribution of spacer material and accordingly, greater uniformity in spacer width after the etch process. An illustration of spacer material 136 after the deposition and etch processes is illustrated in FIG. 4 at 135.

At operation 116, spacer material 136 is trimmed to a desired dimension. At this operation, sacrificial material 132 can be trimmed as well. Because, in the illustrated example, the operations are intended to arrive at layout elements 126, 127, the trim pattern is sized to the longitudinal dimension of layout elements 126, 127. An example of this is illustrated by dashed lines 142 at 140 of FIG. 4. In the illustrated example, dashed line 142 can define a resist contour that is used to protect materials on the substrate. Accordingly, spacer materials outside the dashed line 142 are removed during the etch process. Again, as noted above, sacrificial material outside dashed line 142 can be removed as well. However, as described below, in this example, such removal of sacrificial material 132 is not necessary at this operation as it can be removed during subsequent processing operations.

At operation 118, sacrificial material 132 is removed leaving behind spacer material 136. An example of this is illustrated at 145 of FIG. 5. As can be seen, remaining spacer material 136 corresponds to the vertical elements of L-shaped layout elements 126, 127. At operation 120, a layer of photoresist is applied and selectively removed to form a pattern for the remaining components of L-shaped layout elements 126, 127. This is illustrated at 150 of FIG. 5 where dashed lines are used to illustrate the photoresist contours for these additional components. Accordingly, at operation 122, the substrate is etched to arrive at layout elements 126, 127. As illustrated at 155, portions of substrate 134 that were not protected by spacer materials 136 for the photoresist defined by contours 152 were removed during the etch process, leaving behind substrate material 134 in the form of the desired patterns.

As this example illustrates, the deposition and etch of spacer material 136 results in contours that are used to define critical features of layout elements 126, 127. Likewise, as in other spacer processes, spacer material can be used to define spacing between components of various layout elements. Accordingly, it is desirable to achieve uniformity in the width of spacer material patterned on a substrate. One way to achieve greater uniformity in spacer widths is to provide a layout that yields a greater uniformity in pattern densities of sacrificial material 132. In other words, if patterns used to define spacer positioning are created on the substrate with a more uniform density across the substrate, then the subsequent spacer deposition and etch process can yield more uniform results.

Figure 6:
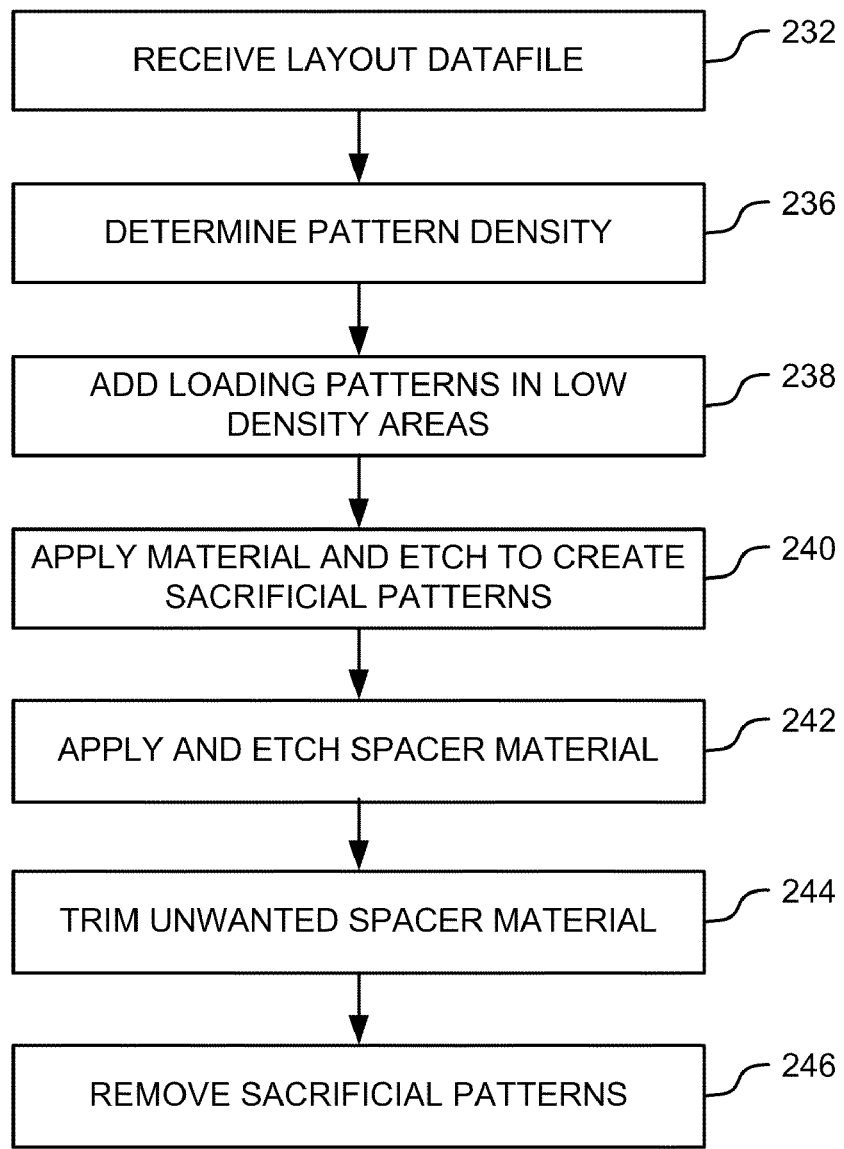
FIG. 6 is an operational flow diagram illustrating an example process for improving spacer uniformity in accordance with one embodiment of the invention.

FIG. 6 is an operational flow diagram illustrating an example process for improving spacer uniformity in accordance with one embodiment of the invention. Referring now to FIG. 6, at operation 232 a layout data file is received. At operation 236, the layout data file is examined to determine pattern density. More particularly, layers that include sacrificial material patterns are examined to determine the density of patterns in a given area or the uniformity of the density of patterns created by the sacrificial material. At operation 238, loading patterns are added in low-density areas to achieve a more uniform density of sacrificial material patterns across a portion of the substrate (i.e., some or all of the substrate area). In one embodiment, these loading patterns, or fill patterns, are merely extraneous patterns that provide no electrical function to the circuit in that neither the loading patterns nor their resultant spacer patterns are used to form layout elements. Instead, these loading patterns are merely intended to provide a more uniform distribution of sacrificial material patterns across the substrate.

At operation 242, spacer material is deposited over the substrate and is subsequently etched to provide a pattern of spacer materials adjacent the sacrificial material. The deposition and etch processes for achieving spacer patterns can include conventional spacer deposition and etch processes. At operation 244, the unwanted spacer materials can be trimmed. Particularly, a layer of photoresist can be deposited and subsequently patterned to protect spacer patterns that will be used to create layout elements. The substrate can then be etched, removing spacer materials not protected by the photoresist. This etch can also remove sacrificial materials not protected by the photoresist contours. At operation 246, remaining sacrificial patterns are removed. In accordance with the above-described process, the photoresist contours applied at operation 244 can first be removed to allow the etch process to reach the unneeded sacrificial patterns.

Figure 7:
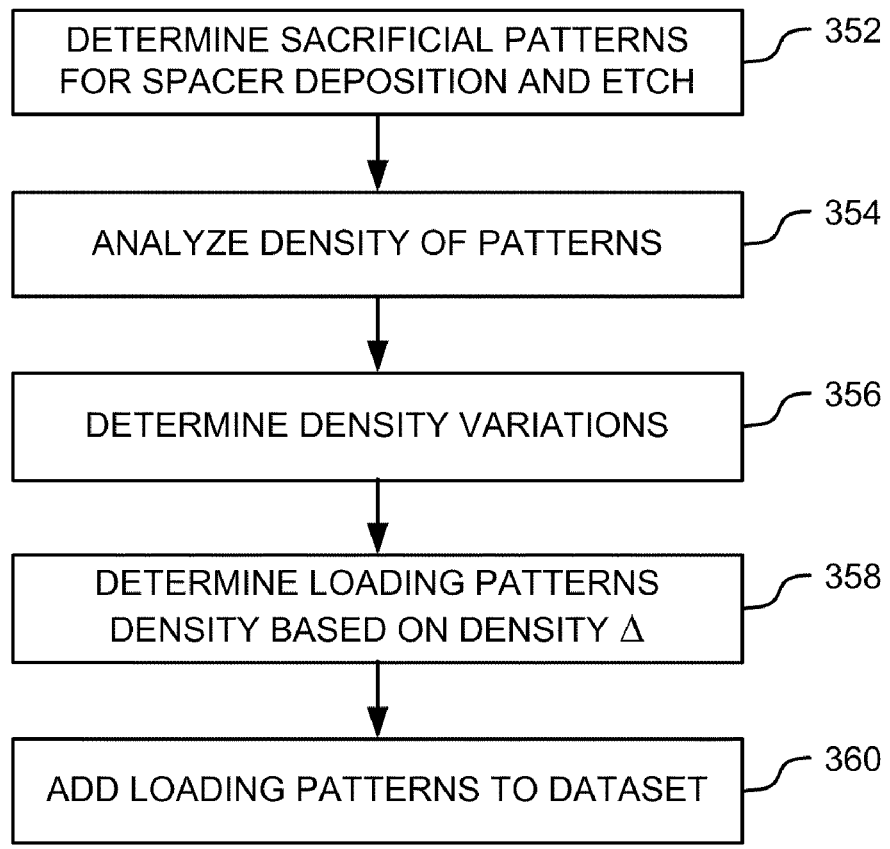
FIG. 7 is an operational flow diagram illustrating an example process for achieving a more uniform pattern density in accordance with one embodiment of the invention.

As described above, in one embodiment, the density of sacrificial materials can be examined and fill patterns or loading patterns applied to achieve a more uniform pattern density across the substrate. FIG. 7 is an operational flow diagram illustrating an example process for achieving a more uniform pattern density in accordance with one embodiment of the invention. Referring now to FIG. 7, at operation 352 the sacrificial patterns for spacer deposition and etch are determined. These can be determined from the data set used for the corresponding lithographic layer. At operation 354, the density of the sacrificial patterns is analyzed. In one embodiment, computational methods can be employed to analyze pattern density in an automated fashion. In another embodiment, the data set can be used to model the pattern layout and this can be displayed to a user for visual inspection. Additionally, computational methods can be used to determine areas of high density and low-density (and gradations in between), and color coding or other visual techniques used to provide a visual representation to the user of pattern density.

At operation 356, variations in pattern density are determined. For example, in one embodiment, the substrate or portions of the substrate interest can be divided into subsets and each subset examined and compared to determine density variations across the subsets. For example, in one embodiment, the subset having a maximum density can be determined and each remaining subset compared to that first subset to determine its density variation from the maximum. In another embodiment, a baseline or preferred density can be determined and the subsets compared to that desired density.

For example, a preferred density might be chosen as that density yielding optimal spacer width results. Subsets can all be of uniform size and area, or they can vary. For example, it may be advantageous to define subsets based on localized densities such as the example described below where density contours are used to define subset areas.

In embodiments where the determinations are performed computationally, subsets can automatically be defined based on a predefined area or they can be defined heuristically based on density regions. For example, density contours can be determined and the subset regions ultimately defined by these density contours. In embodiments where the pattern is visually displayed to a user, the user might be provided with input devices such as, for example, a mouse or other pointing device to manually select areas or subsets based on pattern densities.

At operation 358, loading patterns are determined based on density differences. For example, each subset can be evaluated to determine the difference between its density and a maximum density or baseline density. From this difference or delta value, computational methods can be used to determine where loading patterns can be placed to conform the subject subset's density to the desired density level. In embodiments where the substrate is not divided into subsets, line spacing can be evaluated and additional lines added in areas where line spacing is above a determined threshold. For example, areas of high density can be evaluated to determine minimum line spacing or minimum spatial areas, or to determine a nominal line spacing or spatial area (rather than being absolute minimum). From this point, the date set can be examined to determine where the line spacing is above this threshold were above the threshold by a certain amount, and additional lines added.

At operation 360, the data set can be augmented to include these additional loading patterns such that these patterns are left on the substrate along with the actual patterns after the first sacrificial material and etch operation. At operation 362, depending on the process, it may be necessary to update the data set for the trimmed mask of to ensure that unwanted spacer materials are removed from the substrate. In the case of the example process described above referenced FIGS. 3, 4 and 5 it is not necessary to update the trimmed mask data set as, in that example, any unwanted fill patterns outside of the contour defined by dashed line 142 would be removed by the etch process anyway. Likewise, in that example, the process of removing sacrificial material removes the sacrificial material from the entire substrate. Accordingly, this would include the additional fill patterns of sacrificial material. As would be apparent to one of ordinary skill in the art after reading this description, the fill patterns could also be kept in place to the extent they do not negatively affect the circuit performance.

In one embodiment, the invention can be implemented such that all of the critical features of the layout elements are defined in one exposure. Additionally, in one embodiment, the critical edges can be defined at the first exposure, thereby allowing self-alignment to occur. Accordingly, in these embodiments, a second exposure can be used for the trim level, and additional exposures are not necessarily required to create larger width portions of the elements.

In another embodiment, the trim level sequence can be changed. Consider the case of the example process described above with reference to FIGS. 3, 4 and 5. In this example, the trim level defining the larger features can occur before the trim of the line-ends. Additionally, the level of the trim of the large patterns can be done before the spacer etch.

In embodiments described above, spacer material is used to define dimensions and placement of the layout elements.

However, conventional spacer processes can exhibit larger than desired variations in spacer width due to variations in pattern density. However, in one embodiment a spacer material can be used to define spaces between the elements rather than the feature itself. Accordingly, variations in spacer dimensions might be less critical in such implementations.

Additionally, as described in detail above, in order to reduce the variation in spacer dimensioning, additional fill or dummy patterns can be added in low-density areas of the layout to make the loading of the pattern more uniform. For example, patterns with no electrical function can be added to areas of the substrate where there are few or no actual device patterns to arrive at a more uniform pattern density across the substrate, or across desired areas of the substrate. In an alternative embodiment, a feedback loop can be added to update the layout to increase the uniformity of pattern density by relocating components. Increasing the uniformity of the pattern density can help to improve the uniformity of spacer deposition and thus lead to a more uniform spacer width across the various elements. These additional fill patterns can, in one embodiment, be deposited during deposition of the initial pattern and removed using the trim mask. Accordingly, this process can be implemented so as to not require an additional mask layer.

At smaller dimensions such as, for example, at 45 nm and below, conventional wisdom indicates that poly-level layouts for logic applications should be gridded layouts or lithography-friendly layouts to improve printability of the patterns. Such a gridded pattern also helps place the spacer in a more uniform environment and therefore achieves better spacer uniformity. At the edge of the cells, additional patterns can be placed to further improve the uniformity.

In one embodiment, the width of the spacer can be modeled by taking into account the deposition process as well as the etch process. In particular, dependency on the proximity can, in one embodiment, be accurately modeled to help place additional patterns to prevent or reduce critical dimension variation. For example, the width of the spacer could be simulated using a model. The model could be obtained by using a calibration test reticle with various spacer environments or densities. By exposing test wafers using this test mask (and processing them all the way to defining the spacers on the wafer), the spacer width could be measured for various environments and a model could be created based on this experimental data.

To assess the spacer width at a given location (x0,y0), the pattern surrounding the location (x0,y0) can be convoluted with a sum of kernel functions representing the magnitude and range of the deposition and etch effects. For example, $$CD(x0, y0) = \sum_{n=1}^{N} \int\int \lambda_n K_n(x - x0, y - y0) M(x, y) dx dy$$

where $K_n$ is a Kernel, $\lambda_n$ a coefficient, and M is the function representing the mask (1=clear, 0=opaque). $K_n$ and $\lambda_n$ would be determined by fitting the experimental data. For example, Gaussian functions of different sigmas could be used as Kernel functions. The result of the convolution at the location (x0,y0) could be used directly to predict the width of the spacer as described in the given equation. Other types of models can be used to describe the etch effects including those, for example, as described in United States Patent Application No. US2007/0143733 A1.

The resulting model can be used for various applications, including, modifying the design (original polygons representing functional circuit elements) to obtain a uniform dimension of the spacer; and changing the design to obtain a desired dimension at a given location in the design. Note that this might not necessarily be the same everywhere, and the model could be used to obtain the desired width at a given location. In a further embodiment, applications can also include model-based placement of fill patterns in order to achieve a uniform dimension of the spacer; and model-based placement of dummy patterns in order to achieve a certain dimension at a certain location. In another embodiment, the applications can be combined.

In another embodiment, the model can be used to create a set of rules to predict the dimensions. For example, rules could be used in design-rule-checker types of tools to modify the design or to add dummy test patterns. In still another embodiment, the model can be used to create a set of rules used to restrict the designs such as, for example, to avoid spacer width variation. Such rules could be integrated into standard design rule sets used by the designer. For example, a rule could tell the designer a range of desirable spacing between features in order to be able to place a fill pattern. This type of rule could be similar to rules used for assist feature placement. Assist features could be used to improve the printability of the design but they are actually not printed on the wafer because they are too small (sometimes referred to as sub-resolution assist features).

In yet another embodiment, the model can be used to create a contour of the final shape of the spacer. This contour could be used, for example, to assess the ultimate electrical characteristics of the chips. For example, the contours can be used to predict transistor or other device dimensions more accurately. In one embodiment, they can be used to update the width and length of the transistors or other devices more accurately, or to predict the accurate interconnect dimensions. In another embodiment, they can be used to update the resistance and capacitance of the interconnects more accurately.

This updated information based on the actual contours can be used by designer in order to better assess critical chip information such as, for example, timing and power consumption. See, for example, U.S. Pat. No. 7,216,320, which discloses the use of actual versus drawn dimensions. Note that the spacer contour prediction can be combined with the other lithography steps (used to define trim and large features) in order to create a simulated contour of the final wafer image.

In one embodiment, the spacer process does not require optical proximity correction (OPC) to correct the size of the spacer, because spacer printing is governed by the thin film deposition and etch operations rather than lithography. Accordingly, dimensions of the spacer patterns are not influenced by lithographic processing. Because feature placement can be influenced by lithographic processing, the OPC can be used for the first layer (the initial pattern) to help ensure that the lines are properly placed. For each spacer, the position of one edge can be set by the lithography process, while the position of the other edge can be determined by the deposition/etch processes. Because the deposition/etch processes come later, the deposition/etch process can also define the width of the spacer.

The printing of the initial feature can be done using a thin hard mask such as, for example, silicon oxide or silicon nitride, on top of a thick layer such as a carbon-based material. The thickness of the layer can be adjusted to achieve a desired spacer thickness and width. For the latter processing operations, the material used to fill the pattern can be the final material needed for the layout elements, or it could be a hard mask that will be used to etch a thick underlying layer (carbon-based material). Ultimately, this stack can be used as a mask to etch the underlying material.

The term substrate can be used to refer to any material onto which a layer of material is disposed. Substrates can be comprised of any of a number of materials or combinations of materials including metals, ceramics, plastics, glass and other materials. Substrates can include semiconductor substrates such as, for example, GaAs, Si, SiGe or any other semiconductor material, and can include, for example, wafers and dice or any other semiconductor structures, including structures in the process of fabrication, having one or more layers formed thereon.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 8:
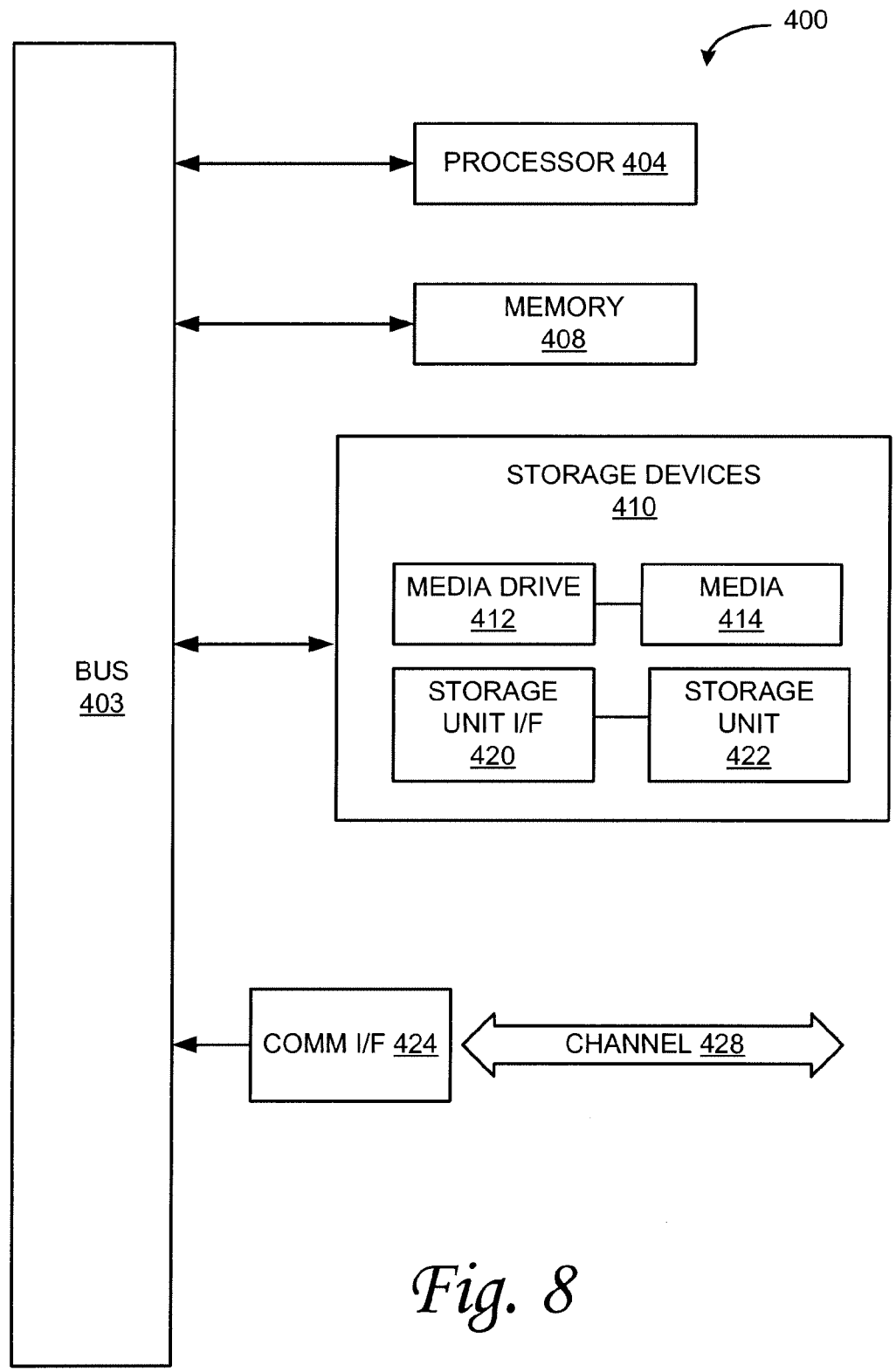
FIG. 8 is a simplified block diagram illustrating an example-computing module in accordance with one embodiment of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 8. Various embodiments are described in terms of this example-computing module 400. After reading this description, it will become apparent to a person skilled in the relevant art how to implement the invention using other computing modules or architectures.

Referring now to FIG. 8, computing module 400 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 400 might also represent computing capabilities embedded within or otherwise available to a given device. For example, a computing module might be found in other electronic devices. Computing module 400 might include, for example, one or more processors or processing devices, such as a processor 404. Processor 404 might be implemented using a general-purpose or special-purpose processing engine such as, for example, a microprocessor, controller, or other control logic. In the example illustrated in FIG. 12, processor 404 is connected to a bus 403 or other communication medium to facilitate interaction with other components of computing module 400.

Computing module 400 might also include one or more memory modules, referred to as main memory 408. For example, preferably random access memory (RAM) or other dynamic memory, might be used for storing information and instructions to be executed by processor 404. Main memory 408 might also be used for storing temporary variables or other intermediate information during execution of instructions to be executed by processor 404. Computing module 400 might likewise include a read only memory ("ROM") or other static storage device coupled to bus 403 for storing static information and instructions for processor 404.

The computing module 400 might also include one or more various forms of information storage mechanism 410, which might include, for example, a media drive 412 and a storage unit interface 420. The media drive 412 might include a drive or other mechanism to support fixed or removable storage media 414. For example, a hard disk drive, a floppy disk drive, a magnetic tape drive, an optical disk drive, a CD or DVD drive (R or RW), or other removable or fixed media drive. Accordingly, storage media 414, might include, for example, a hard disk, a floppy disk, magnetic tape, cartridge, optical disk, a CD or DVD, or other fixed or removable medium that is read by, written to or accessed by media drive 412. As these examples illustrate, the storage media 414 can include a computer usable storage medium having stored therein particular computer software or data.

In alternative embodiments, information storage mechanism 410 might include other similar instrumentalities for allowing computer programs or other instructions or data to be loaded into computing module 400. Such instrumentalities might include, for example, a fixed or removable storage unit 422 and an interface 420. Examples of such storage units 422 and interfaces 420 can include a program cartridge and cartridge interface, a removable memory (for example, a flash memory or other removable memory module) and memory slot, a PCMCIA slot and card, and other fixed or removable storage units 422 and interfaces 420 that allow software and data to be transferred from the storage unit 422 to computing module 400.

Computing module 400 might also include a communications interface 424. Communications interface 424 might be used to allow software and data to be transferred between computing module 400 and external devices. Examples of communications interface 424 might include a modem or softmodem, a network interface (such as an Ethernet, network interface card, WiMedia, 802.XX or other interface), a communications port (such as for example, a USB port, IR port, RS232 port Bluetooth interface, or other port), or other communications interface. Software and data transferred via communications interface 424 might typically be carried on signals, which can be electronic, electromagnetic, optical or other signals capable of being exchanged by a given communications interface 424. These signals might be provided to communications interface 424 via a channel 428. This channel 428 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 408, storage unit 420, media 414, and signals on channel 428. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 400 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the operations are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof, the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method of determining a dataset for a layer of a semiconductor device, comprising:
   receiving a dataset defining a plurality of original patterns of sacrificial material in a layer of a semiconductor device, wherein the original patterns of sacrificial material are used to define placement of spacer material to define patterning of circuit elements for the semiconductor device;
   determining densities of the plurality of original patterns of sacrificial material in areas across a portion of the layer of the semiconductor device; and
   using a computer system to augment the dataset to include an additional pattern of sacrificial material in an area of the layer having a density lower than a threshold density.

2. The method of claim 1, wherein the threshold density is determined based on predefined spacer widths.

3. The method of claim 1, wherein the threshold density is determined based on the density of an area of the layer having the highest density of original patterns.

4. The method of claim 1, further comprising determining a variation in the density of original patterns across the portion of the layer, and determining the additional pattern to be added to an area of lower density based on a difference in density between an area of higher density and the area having a density lower than a determined threshold density.

5. The method of claim 1, further comprising calculating a loading pattern density based on the determined density of original patterns across the area.

6. The method of claim 1, wherein, augmenting the dataset increases the uniformity of pattern density across the area of the substrate.

7. The method of claim 1, wherein the additional patterns of sacrificial material comprise extraneous patterns that provide no electrical function to the circuit.

8. The method of claim 1, wherein the method is performed by a computer program product embodied on non-transitory computer usable media.

9. A computer aided design apparatus for generating a data file for a layer of a semiconductor device, comprising:
   a processor;
   a memory connected to the processor; and
   a computer readable medium having computer program code embedded therein, the computer program code configured to cause the processor to perform the operations of:
   receiving a dataset defining a plurality of original patterns of sacrificial material in a layer of a semiconductor device, wherein the original patterns of sacrificial material are used to define placement of spacer material to define patterning of circuit elements for the semiconductor device;
   determining densities of the plurality of original patterns of sacrificial material in areas across a portion of the layer of the semiconductor device; and
   augmenting the dataset to include an additional pattern of sacrificial material in an area of the layer having a density lower than a threshold density.

10. The computer aided design apparatus of claim 9, wherein the threshold density is determined based on predefined spacer widths.

11. The computer aided design apparatus of claim 9, wherein the threshold density is determined based on the density of an area of the layer having the highest density of original patterns.

12. The computer aided design apparatus of claim 9, wherein computer program code is further configured to cause the processor to determine a variation in the density of original patterns across the portion of the layer, and determining the additional pattern to be added to an area of lower density based on a difference in density between an area of higher density and the area having a density lower than a determined threshold density.

13. The computer aided design apparatus of claim 9, wherein computer program code is further configured to cause the processor to calculate a loading pattern density based on the determined density of original patterns across the area.

14. The computer aided design apparatus of claim 9, wherein, augmenting the dataset increases the uniformity of pattern density across the area of the substrate.

15. The computer aided design apparatus of claim 9, wherein the additional patterns of sacrificial material comprise extraneous patterns that provide no electrical function to the circuit.

16. A method of determining a dataset for a layer of a semiconductor device, comprising:
   receiving a dataset defining a plurality of original patterns of sacrificial material in a layer of a semiconductor device, wherein the original patterns of sacrificial material are used to define placement of spacer material to define patterning of circuit elements for the semiconductor device;
   determining densities of the plurality of original patterns of sacrificial material in areas across a portion of the layer of the semiconductor device; and
   using a computer system to alter the density in an area of the layer to achieve a desired spacer material width.

17. The method of claim 16, wherein altering the density comprises adding an additional pattern of sacrificial material in the area of the layer.

18. A method of determining a dataset for a layer of a semiconductor device, comprising:
   receiving a dataset for an integrated circuit design, the dataset defining a plurality of original patterns of sacrificial material in a layer of a semiconductor device, wherein the original patterns of sacrificial material are used to define placement of spacer material to define patterning of circuit elements for the semiconductor device;
   determining densities of the plurality of original patterns of sacrificial material in areas across a portion of the layer of the semiconductor device; and
   using a computer system to alter the integrated circuit design to adjust the density of original patterns in an area of the layer to achieve a desired spacer material width for that area.

* * * * *